(12) United States Patent
Yandoc et al.

(10) Patent No.: US 12,347,751 B2
(45) Date of Patent: Jul. 1, 2025

(54) SEMICONDUCTOR DEVICE AND A METHOD OF MANUFACTURE

(71) Applicant: NEXPERIA B.V., Nijmegen (NL)

(72) Inventors: Ricardo Yandoc, Nijmegen (NL);
Florante Fenol, Nijmegen (NL);
Marlon Fadullo, Nijmegen (NL);
Ramil Atienza, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 235 days.

(21) Appl. No.: 17/245,519

(22) Filed: Apr. 30, 2021

(65) Prior Publication Data
US 2021/0343627 A1 Nov. 4, 2021

(30) Foreign Application Priority Data

May 1, 2020 (EP) ..................................... 20172575

(51) Int. Cl.
*H01L 23/495* (2006.01)
*H01L 21/48* (2006.01)
*H01L 23/00* (2006.01)

(52) U.S. Cl.
CPC .... *H01L 23/49524* (2013.01); *H01L 21/4825* (2013.01); *H01L 21/4828* (2013.01);
(Continued)

(58) Field of Classification Search
CPC ......... H01L 23/49513; H01L 23/49562; H01L 23/49548; H01L 23/49524; H01L 23/49575; H01L 2224/95; H01L 2224/291; H01L 2224/37147; H01L 2224/40499; H01L 2224/4103; H01L 2224/41051; H01L 2224/84815; H01L 2224/3701; H01L 2224/37013; H01L 2224/83192; H01L 2224/83801; H01L 2224/83815; H01L 2224/32245; H01L 2224/73263; H01L 2224/35847; H01L 2224/35831; H01L 2224/0603; H01L 24/37; H01L 24/40; H01L 24/29; H01L 24/05; H01L 24/08; H01L 24/32; H01L 24/35; H01L 21/4828;
(Continued)

(56) References Cited

U.S. PATENT DOCUMENTS 8,884,420 B1 * 11/2014 Hosseini ................. H01L 24/37
257/676
2004/0061221 A1 * 4/2004 Schaffer ................. H01L 24/37
257/692

(Continued)

FOREIGN PATENT DOCUMENTS

EP 2930747 A1 10/2015
JP 2009038126 A 2/2009
JP 5165302 B2 * 3/2013 ............. H01L 24/36

OTHER PUBLICATIONS

Extended European Search Report for corresponding European application EP20172575.1 9 pages, dated Jul. 13, 2020.

*Primary Examiner* — Shaun M Campbell
*Assistant Examiner* — Aneta B Cieslewicz
(74) *Attorney, Agent, or Firm* — Ruggiero McAllister & McMahon LLC

(57) ABSTRACT

A semiconductor device including a lead frame, a die attached to the lead frame using a first solder, and a clip attached to the die using a second solder is provided. The clip includes a notch arranged for a check of the excess of the second solder.

19 Claims, 5 Drawing Sheets

(52) U.S. Cl.
CPC .... *H01L 21/4842* (2013.01); *H01L 23/49513* (2013.01); *H01L 23/49562* (2013.01); *H01L 24/37* (2013.01); *H01L 24/40* (2013.01); *H01L 24/32* (2013.01); *H01L 24/35* (2013.01); *H01L 24/83* (2013.01); *H01L 24/84* (2013.01); *H01L 2224/0603* (2013.01); *H01L 2224/35831* (2013.01); *H01L 2224/3701* (2013.01); *H01L 2224/37013* (2013.01); *H01L 2224/37147* (2013.01); *H01L 2224/40499* (2013.01); *H01L 2224/4103* (2013.01); *H01L 2224/41051* (2013.01); *H01L 2224/84815* (2013.01); *H01L 2924/181* (2013.01)

(58) Field of Classification Search
CPC . H01L 2924/181; H01L 23/495–49596; H01L 2224/34–41505; H01L 2224/73–73281; H01L 2224/84–84986; H01L 2224/83–83986; H01L 2224/02–0603; H01L 2224/26–33519; H01L 2224/93–97; H01L 2224/01–70; H01L 21/48–4896; H01L 21/50–607; H01L 24/80–89
See application file for complete search history.

(56) References Cited

U.S. PATENT DOCUMENTS

| | | | |
|---|---|---|---|
| 2014/0273344 A1* | 9/2014 | Terrill | H01L 24/92 438/107 |
| 2017/0069563 A1 | 3/2017 | Miyakawa | |
| 2018/0012829 A1* | 1/2018 | Mangrum | H01L 23/49575 |
| 2018/0350726 A1 | 12/2018 | Mangrum | |

* cited by examiner

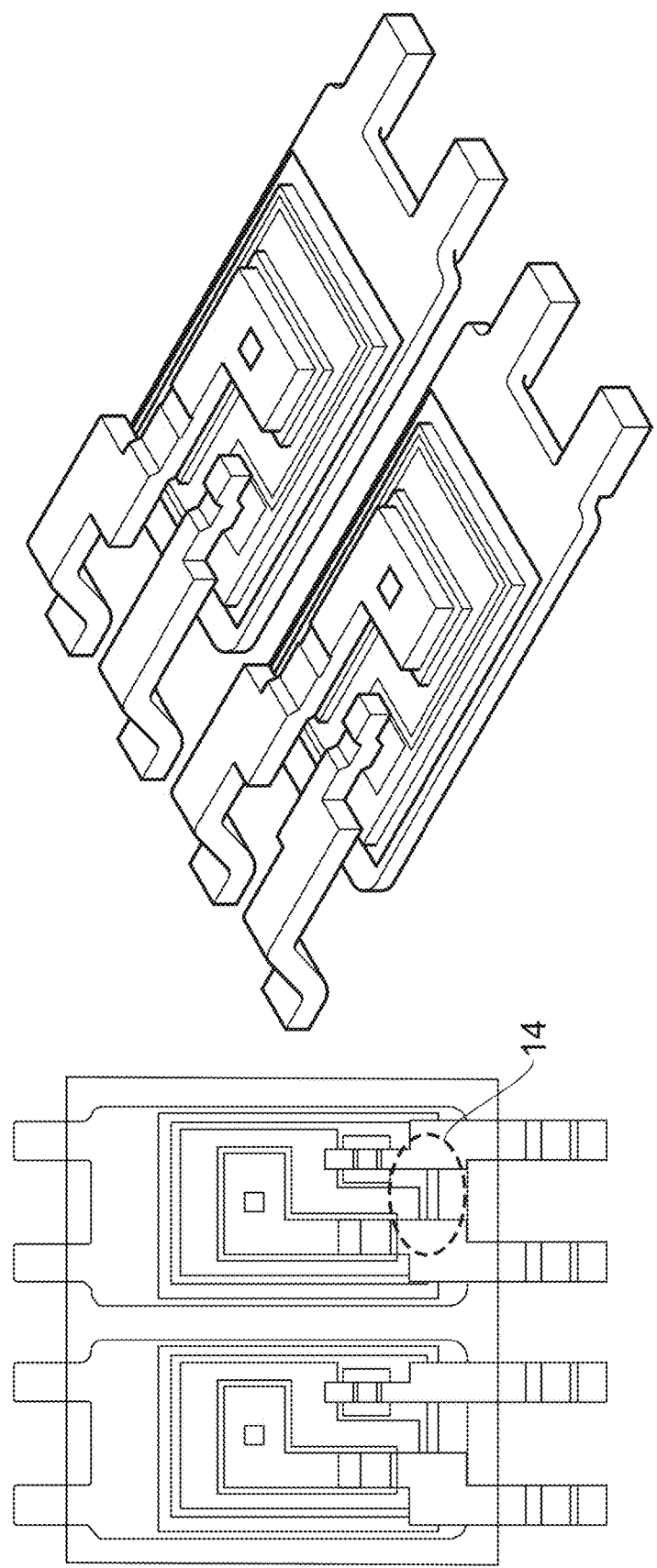
FIG. 2a (Prior Art)
FIG. 2b (Prior Art)
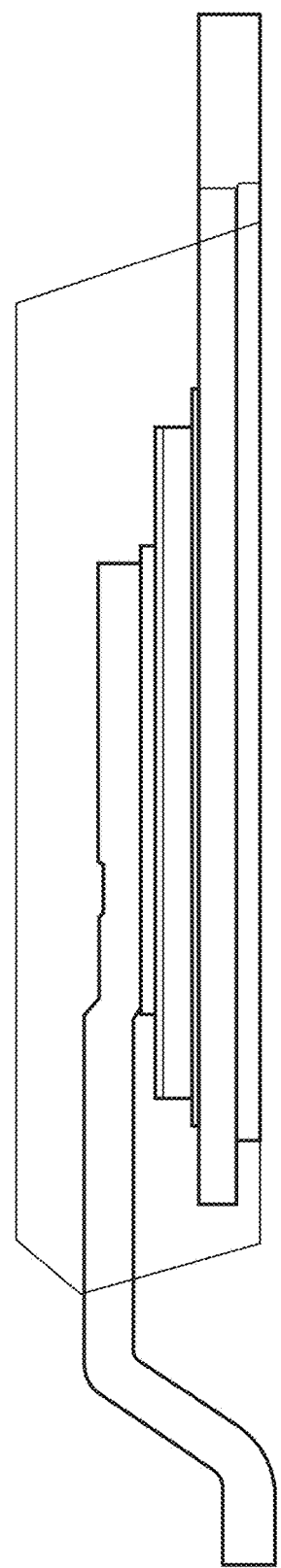
FIG. 2c (Prior Art)

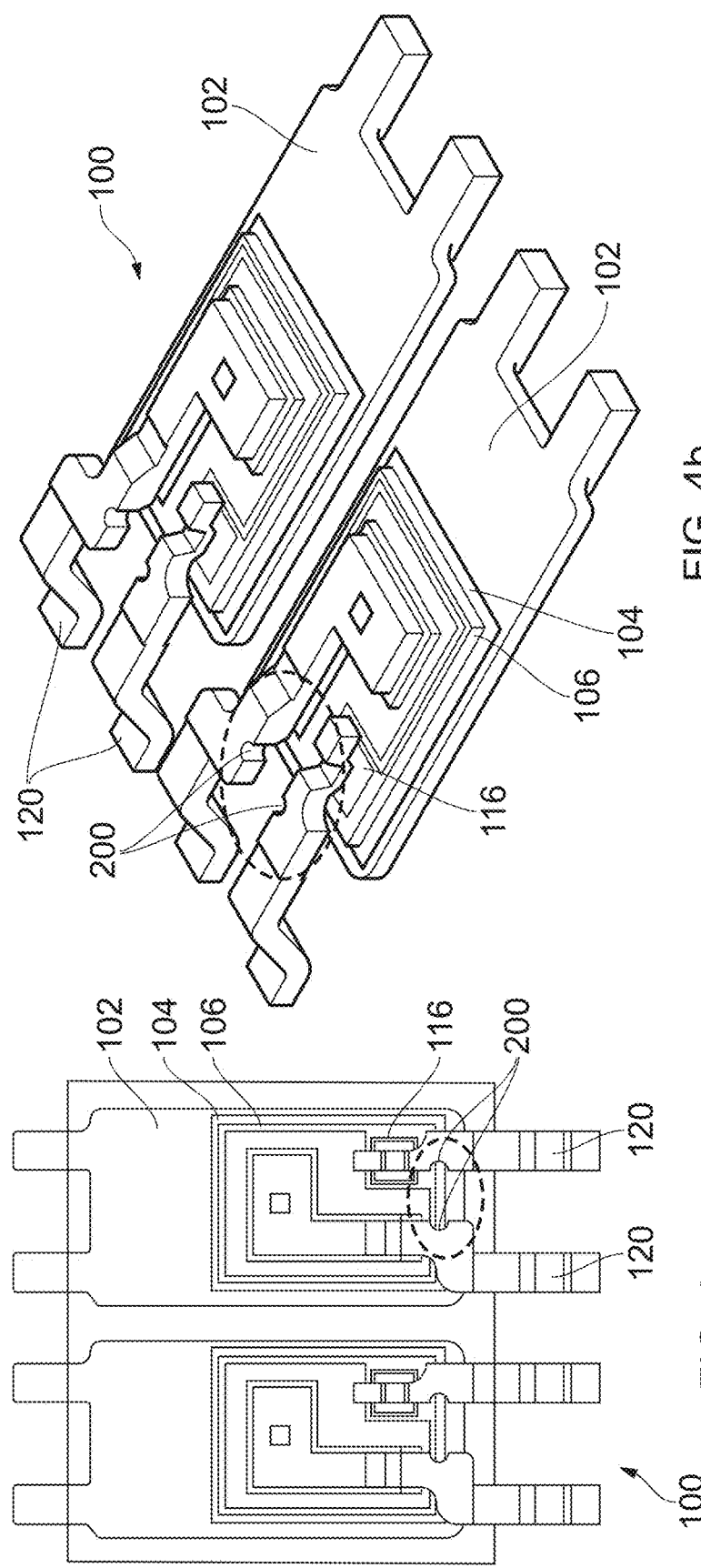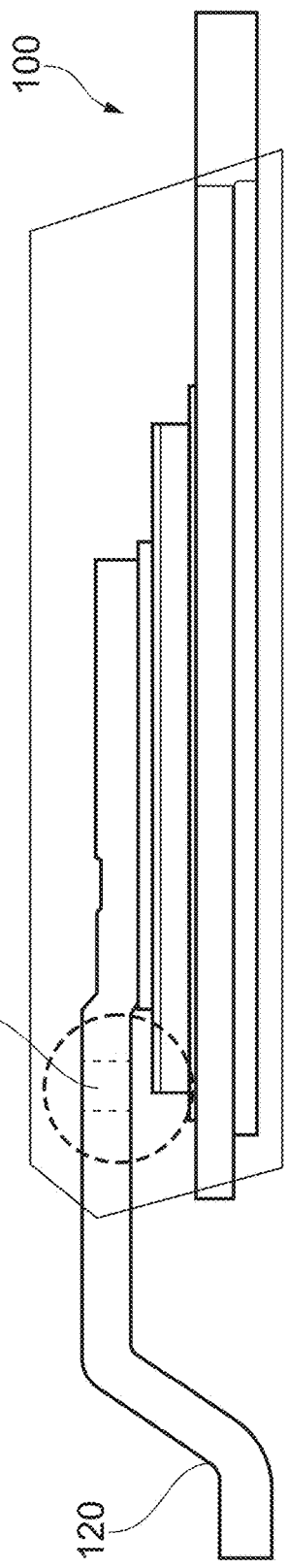
FIG. 4a
FIG. 4b
FIG. 4c

SEMICONDUCTOR DEVICE AND A METHOD OF MANUFACTURE

CROSS REFERENCE TO RELATED APPLICATION

This application claims the benefit under 35 U.S.C. § 119(a) of European Application No. 20172575.1 filed May 1, 2020 the contents of which are incorporated by reference herein in their entirety.

BACKGROUND OF THE DISCLOSURE

1. Field of the Disclosure

The present invention relates to a method of forming a semiconductor device. The invention also relates to a method of manufacturing a semiconductor device.

2. Description of the Related Art

Semiconductor devices, for example MOSFET devices, are known to have a problem with excessive solder dispensed on top of die. This is shown in FIGS. 1a and 1b. A solder 10 is reaching the die edge due to a very narrow gap between the source clip and the die. This problem can be detected only using an x-ray inspection, using an electrical testing or using cross sections. FIG. 1a shows a result of the x-ray inspection. In FIG. 2 a typical cross section of a package is shown, wherein the material layers and an excessive solder under the source clip are visible. The device will not function properly and will result to current leakages since the excessive solder is bridging 12 the drain to the source potential.

This known problem where an uncontrolled solder is dispensed on the source solderable top contact, which results to an excessive amount of solder, which causes the bridging between the drain and the source/the gate of a MOSFET device.

There are some known methods of solving the problem described above. Some of these methods require a major change of a die design, which is very expensive and inefficient. Other possibility is to provide an additional excess solder detection equipment, which also will be an expensive and inefficient option. Furthermore, a change of a MOSFET device package outline can be done, but this will result in a modification of a mould tool and trim forming singulation tool (TFS). Similarly to the previous options, this one will be also very expensive and inefficient to implement. In general, any changes that will impact a die size, an electrical performance and a package outline will be very difficult, and therefore expensive and inefficient, to implement.

Normally the production operators will follow the succeeding steps for an additional excess solder detection when manufacturing a MOSFET device. Firstly, an operator will pull out few production-assembled samples to check for an excessive solder by bringing these to x-ray room, which can be located in a different area. If there are darker images or shadow observed under the clips, this is an indication that an excessive amount of solder has been dispensed. The operators will then go back to the machine and adjust the solder dispense settings. They will repeat the process until they do not see traces of excessive solder under the clips anymore. Secondly, if an operator failed or missed to check the samples by x-ray, the next possibility to check for an excessive solder problem is by conducting electrical testing. However, before this final test can take place, the device needs to be completed, i.e. the whole assembly process (moulding, plating and singulation) has to be finalized, since the operator will not be able to test the MOSFET device before it is encapsulated or moulded by plastic, and singulated from the lead frame. Thus, before the excessive solder was found out by the final testing, many of the MOSFET devices will be already assembled and must be rejected. In case that the testing failed to filter the excessive solder due to a marginal case, the MOSFET device will not be rejected and may fail during the usage of such a MOSFET device; which obviously is not a preferred option as it may cause potential customer complaint. Thirdly, the operators can further verify any shorted device by repeating the x-ray process or by conducting a cross section which will take few days before having a result. To conclude, all of the above steps for managing a problem of an excessive solder are not preferred since they could be expensive and/or time consuming, which is simply unacceptable in the MOSFET devices industry.

A top view, an isometric view and a side view of a known MOSFET device is shown in FIGS. 2a, 2b and 2c respectively. Any excessive solders, e.g. at a marked position 14 are not visible by a visual inspection.

A known solution for an excessive solder inspection is shown in FIGS. 3a and 3b. Solder inspection holes 16 are used to visually check for an excessive solder. However, this causes a narrow width 18 when the inspection holes 16 are created. Such a narrow width will cause a higher package resistance. This higher package resistance will result in more power consumption by the MOSFET device. The examples with the inspection holes 16 shown in FIG. 3b are only applicable for wider leads. Such inspection holes are not suitable for a MOSFET device with narrow leads. For example, these inspection holes cannot be used in a dual die paddle clip bonded package. Any hole added in a narrow lead will result to an increase of a package resistance and an instability of the lead coplanarity during the stamping process.

To conclude, none of the solutions for an excessive solder inspection as described above is not suitable for MOSFET and other semiconductor devices where narrow leads are required.

SUMMARY

Various example embodiments are directed to the disadvantage as described above and/or others which may become apparent from the following disclosure.

According to an embodiment of this invention a semiconductor device comprises a lead frame, a die attached to the lead frame using a first solder, and a clip attached to the die using a second solder. The clip comprises a notch arranged for a check of the excess of the second solder.

Using such a notch enables an excess solder inspection without modification of package outline, current die designs and no change in the manufacturing steps.

By introducing the notch feature in the clip, it is easy for an operator to visually judge if solder is excessive or not without getting away from the manufacturing machines to perform an expensive and time-consuming x-ray inspection of the semiconductor device. Therefore, the present invention provides cost savings and prevents potential quality issues of the produced semiconductor devices.

Furthermore, the notch will not contribute an increase of the package resistance since the notch does not make the width of the clip significantly narrower. According to an embodiment of the invention, the shape of the notch is a rectangular or a half-circle. In case that the shape of the notch is a half-circle, it is preferable that a radius of the half-circle is of the same or similar size as the thickness of the clip. In another preferred embodiment of the present invention the radius of the half-circle and the thickness of the clip are around 0.2 mm.

In an embodiment of the present invention the notch is made by a copper stamping or by an etching process. The copper stamping process is relatively cheap in terms of the mass production compared to the use of a chemical etching process. In a preferred embodiment of the present invention the semiconductor device is a MOSFET device, wherein the MOSFET devices comprises a source, a gate and a drain. The notch is positioned between the source and the drain, and/or between the gate and the drain of the MOSFET device.

The invention also relates to a method of producing a semiconductor device, wherein the method, among other standard manufacturing steps, comprises the following steps: forming a lead frame, attaching a die to the lead frame using a first solder, and attaching a clip to the die using a second solder. The clip comprises a notch arranged for a check of the excess of the second solder. Again, the shape of the notch can be a rectangular or a half-circle. In case that the shape of the notch is a half-circle, in a preferred embodiment of the present invention a radius of such a half-circle is of the same or similar size as the thickness of the clip. Preferably, the radius of the half-circle and the thickness of the clip are around 0.2 mm. The notch can be made by a copper stamping or by an etching process.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale.

Advantages of the subject matter claimed will become apparent to those skilled in the art upon reading this description in conjunction with the accompanying figures, in which like reference numerals have been used to designate like elements, and in which:

FIGS. 2a, 2b and 2c show a top view, an isometric view and a side view respectively of a known MOSFET device.

FIGS. 4a, 4b and 4c show a top view, an isometric view and a side view respectively of a semiconductor device according to an embodiment of the disclosure.

DETAILED DESCRIPTION

Figure 1A:
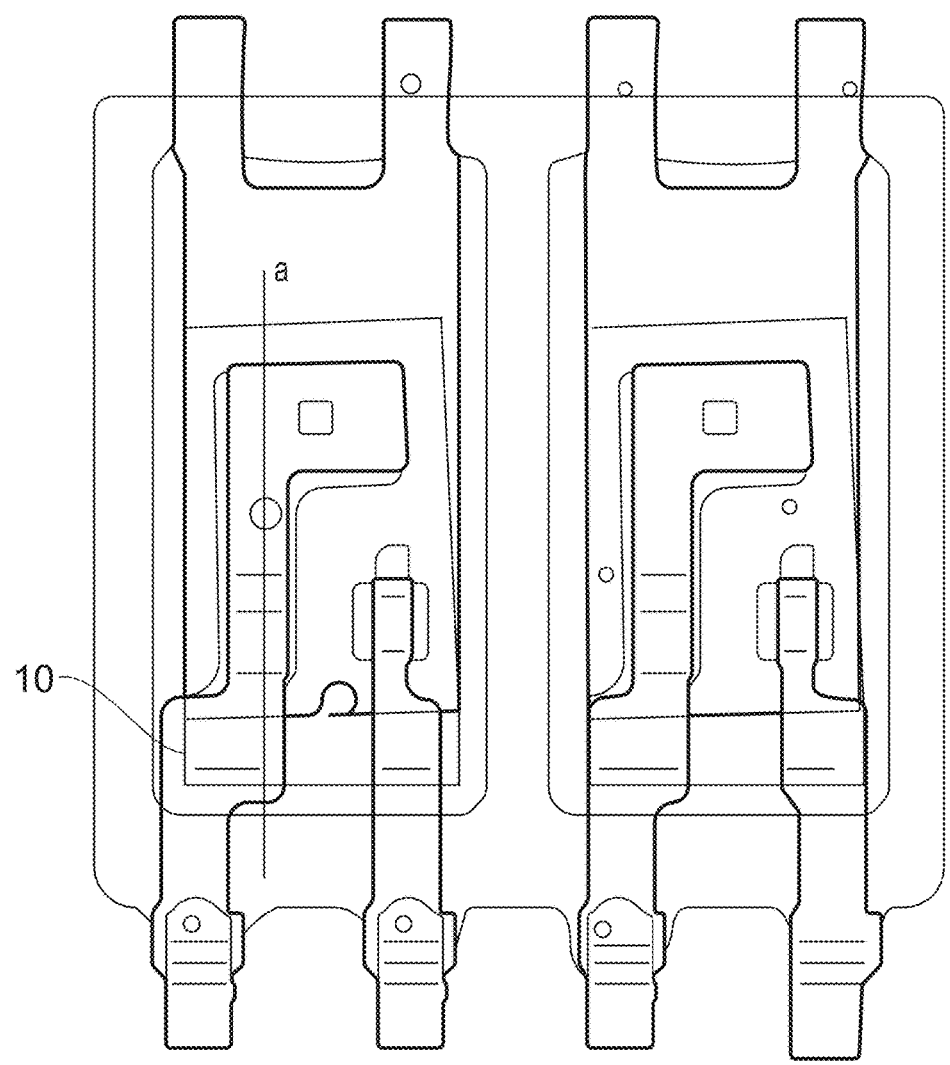
FIGS. 1a and 1b show a known MOSFET device wherein an excessive solder is dispensed on the top of the die.
Figure 1B:
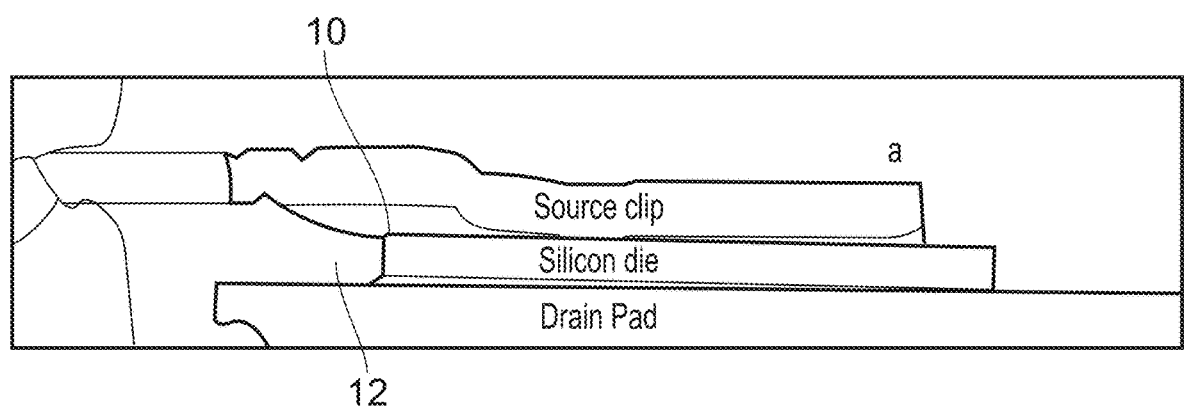
Figure 3A:
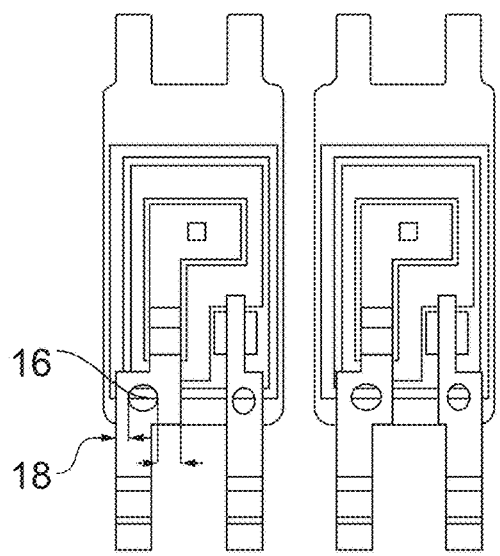
FIGS. 3a and 3b show known MOSFET devices with solder inspection holes.
Figure 3B:
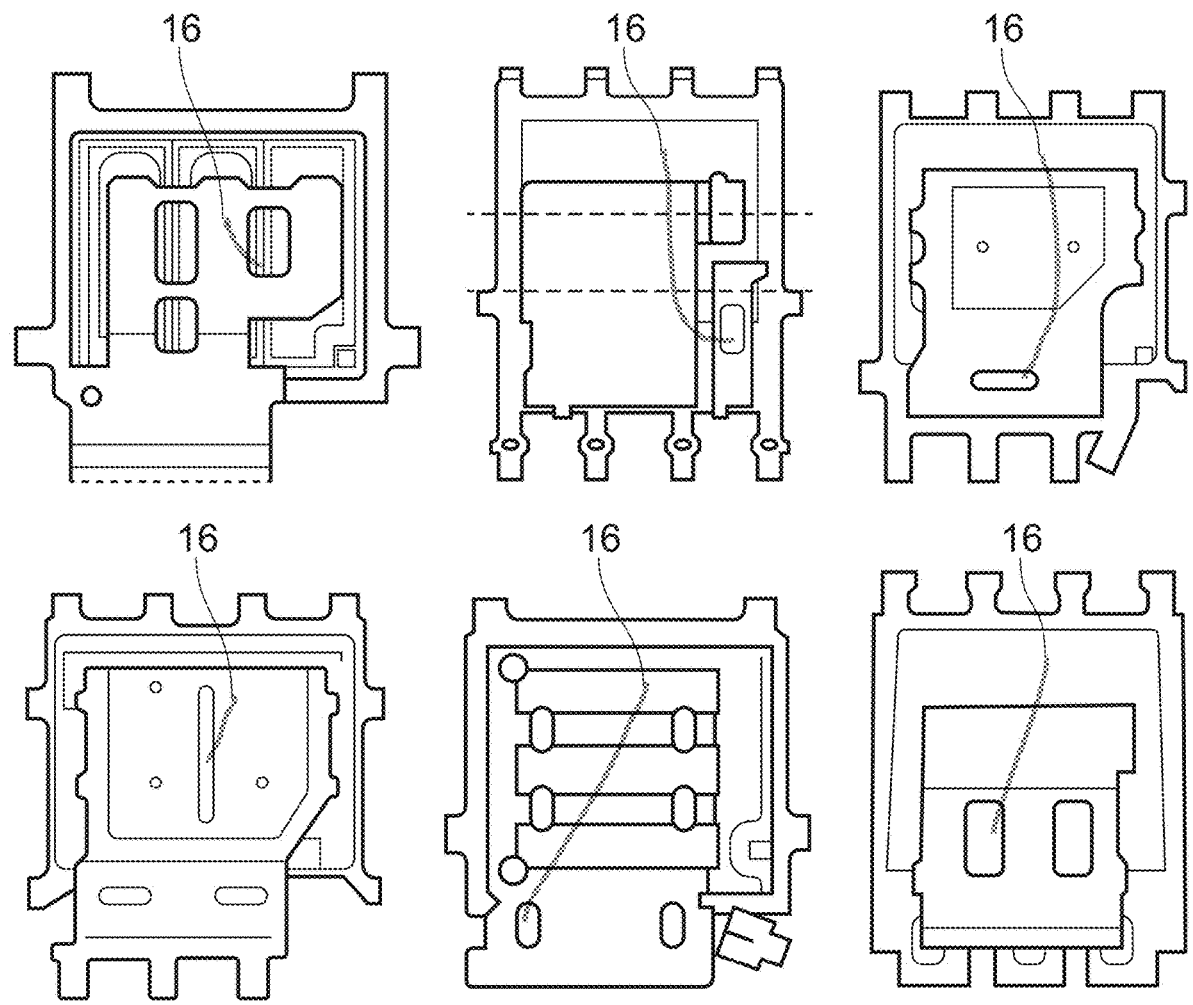

An embodiment of the disclosure is shown in FIGS. 4a, 4b and 4c. These Figures show a top view, an isometric view and a side view respectively of a semiconductor device 100, i.e. a MOSFET device, an insulated gate bipolar transistor, a bipolar transistor, a JFET device, a thyristor, a diode, and the like.

The semiconductor device 100 comprises a lead frame 102, and a die 106 attached to the lead frame 102 using a first solder 104. A clip 120 is attached to the die 106 using a second solder 116. The clip 120 comprises a notch 200 arranged for a check of the excess of the second solder 116. In the example shown in FIGS. 4a, 4b and 4c, the notch 200 is a side notch. Having such a notch 200 feature enables easy visual inspection of the excess of the second solder 116 in a relatively simple way, i.e. without the use of an expensive x-ray machine.

The side notch 200 can have different shapes, for example a rectangular shape, a half circle shape (as illustrated in the example embodiment in FIGS. 4a, 4b and 4c), etc. The notch 200 can be created by a through copper stamping, by an etching process, etc. If the notch 200 is of a half circle shape, in a preferred example embodiment a minimum size of the radius of the half circle shape is the same size as the thickness of the clip 120. The clip 120 can me made of copper. In a preferred embodiment of the disclosure the size of this radius and the thickness of the clip 120 are around 0.2 mm, or similar.

It is recommended to provide such a notch 200 in the places where the excess of the solder should be checked. In an example embodiment of this disclosure the notch 200 is placed between the source potential and the gate potential of the semiconductor device 100 from one side and an edge of the die 106 from other side. This edge of the die 106 corresponds to the drain potential of the semiconductor device. Within the production of the semiconductor device 100, due to the present of the notch 200, a machine operator will be able to stop a possible excess of the solder and consequently to adjust a dissension of the solder immediately.

The notch 200 is particularly designed not to reduce the width of the clip 120, so to secure that the spreading resistance on the source terminals of the semiconductor device 100 is maintained.

By introducing the notch 200 in the clip 120, the problems of the prior art described above are solved. An operator can visually judge if the solder is excessive. There is no need to use other expensive and inefficient methods mentioned above, such as a x-ray inspection of the semiconductor device. Thus, the implementation of this disclosure clearly saves costs and prevents possible quality issues that can be caused by the excess of the solder.

As it is shown in the example embodiment in FIGS. 4a and 4b, the notch 200 is provided on the clip 120 for the source of the semiconductor device and also on the clip 120 for the gate of the semiconductor device. This is particularly advantageous for the MOSFET devices that required a lower spreading resistance, and the notch 200 according to an embodiment of the disclosure supports such a lower spreading resistance. The notch will not contribute an increase of the package resistance since the notch 200 does not make the width of the clip 120 significantly narrower.

Another advantage of using the notch 200 is it can be done by a copper stamping process, which is a relatively cheap in terms of the mass production compared to the use of a chemical etching process which can be 10 times more costly. The copper stamping process is not suitable for a narrow width of the clip, but it is suitable for the notch according to an embodiment of this disclosure since the width of the clip is wide enough.

Figure 5:
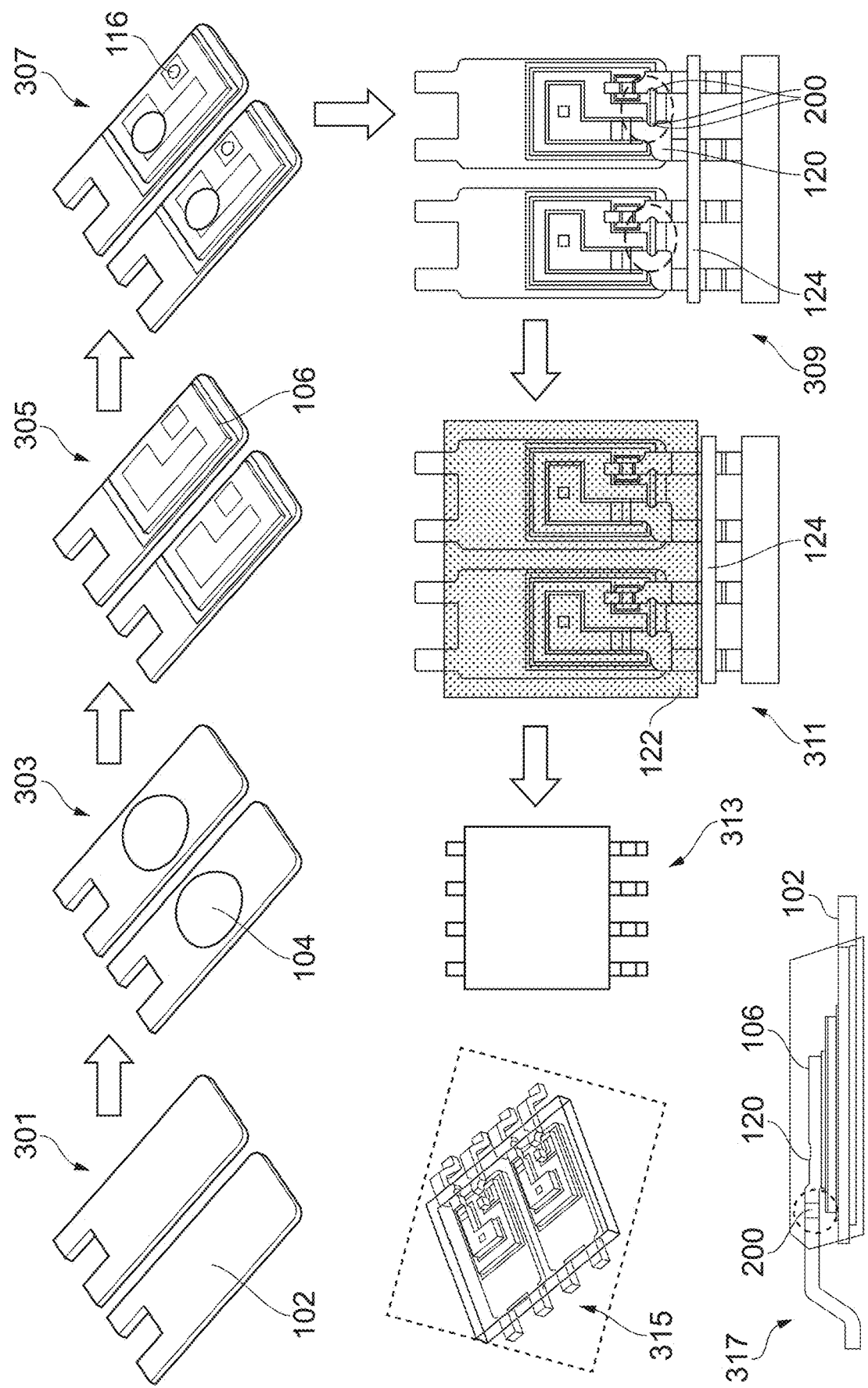
FIG. 5 shows a method of manufacturing of a semiconductor device according to an embodiment of this disclosure.

A method of manufacturing a semiconductor device according to an embodiment of the disclosure is shown in FIG. 5.

The method comprises the steps:
step 301: providing a lead frame 102 which can be stamped or etched bottom
step 303: print, write or dispense a first solder 104 on the lead frame 102
step 305: forming a die 106 attached to the lead frame 102 using a first solder 104
step 307: print, write or dispense a second solder 116 on the die 106
step 309: forming clips 120 comprising a notch 200 and attaching the clips 120 on top of the silicon die 106; the clips 120 contain source and gate terminals; a dambar 124 is connecting these terminals; so assembled parts will then go towards a reflow process to cure the solidify or to cure the solder applied
step 311: perform a moulding of the cured and assembled device from the previous step, so to encapsulate the silicon with an encapsulant 122; an encapsulation is required to protect the silicon dies from any oxidation and contamination; the product will further undergo tin (Sn) plating process after moulding so to plate external leads in order to protect the copper from oxidation
step 313: perform trim/form/singulation (TFS) process wherein some parts of the lead frames and clips will be removed to make the final semiconductor device
step 315: perform cut of the dambar 124, wherein the singulated semiconductor device is created The step 315 as shown in FIG. 5 is a top view of the singulated semiconductor device. Items 317 and 319 in FIG. 5 show an isometric view and a side view respectively of this singulated semiconductor device wherein inner layers are visible.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A semiconductor device comprising:
transistor comprising a source, a gate, and a drain;
a lead frame;
a die of the transistor connected to the lead frame using a first solder;
a clip connected to the die using a second solder, the clip comprising a plurality of notches arranged for a check of an excess of the second solder,
wherein the clip comprises:
a source clip for the source of the transistor comprising a source terminal and at least one of the plurality of notches provided on the source clip over an edge of the die; and a gate clip for the gate of the transistor comprising a gate terminal and another of the plurality of notches provided on the gate clip over the edge of the die.

2. The semiconductor device as claimed in claim 1, wherein the at least one of the plurality of notches has a shape that is a rectangle or a half-circle.

3. The semiconductor device as claimed in claim 1, wherein the plurality of notches are made by a copper stamping or by an etching process.

4. The semiconductor device as claimed in claim 2, wherein the plurality of notches are made by a copper stamping or by an etching process.

5. The semiconductor device as claimed in claim 2, wherein the shape of the at least one of the plurality of notches is a half-circle, and wherein the half-circle has a radius that is of a same or similar size as a thickness of the clip.

6. The semiconductor device as claimed in claim 5, wherein the radius of the half-circle and the thickness of the clip are each about 0.2 mm.

7. The semiconductor device as claimed in claim 1 wherein the at least one of the plurality of notches is provided over the edge of the die on the source clip and is positioned facing the another of the plurality of notches provided over the edge of the die on the gate clip.

8. The semiconductor device as claimed in claim 7, wherein the transistor is a MOSFET device.

9. The semiconductor device as claimed in claim 1, wherein the another of the plurality of notches is positioned above the drain in a plan view of the semiconductor device.

10. The semiconductor device as claimed in claim 7, wherein the at least one notch of the plurality of notches provided over the edge of the die on the source clip and the another of the plurality of notches provided over the edge of the die on the gate clip are positioned above the drain from a plan view of the semiconductor device.

11. A method of producing a semiconductor device, the method comprising the steps of:
forming a lead frame;
attaching a die for a semiconductor transistor comprising a source, a gate, and a drain to the lead frame using a first solder; and
attaching a clip to the die using a second solder, the clip comprising a plurality of notches arranged for a check of an excess of the second solder, wherein the clip comprises:
a source clip for the source of the transistor comprising a source terminal and at least one of the plurality of notches provided over the edge of the die on the source clip; and
a gate clip for the gate of the transistor comprising a gate terminal and another of the plurality of notches provided over the edge of the die on the gate clip.

12. The method of producing a semiconductor device as claimed in claim 11, wherein the at least one of the plurality of notches has a shape that is rectangular or a half-circle.

13. The method of producing a semiconductor device as claimed in claim 11, wherein the at least one of the plurality of notches is made by a copper stamping or by an etching process.

14. The method of producing a semiconductor device as claimed in claim 12, wherein the at least one of the plurality of notches is made by a copper stamping or by an etching process.

15. The method of producing a semiconductor device as claimed in claim 12, wherein the shape of the at least one of the plurality of notches is a half-circle, and wherein the half-circle has a radius that is of a same or similar size as a thickness of the clip.

16. The method of producing a semiconductor device as claimed in claim 15, wherein the radius of the half-circle and the thickness of the clip each are about 0.2 mm.

17. The method of producing a semiconductor device as claimed in claim 11, wherein the at least one of the plurality of notches provided on the source clip over the edge of the die is positioned facing the another of the plurality of notches provided on the gate clip over the edge of the die.

18. The method of producing a semiconductor device as claimed in claim 17, wherein the another of the plurality of notches is positioned above the drain from a plan view of the semiconductor device.

19. The method of producing a semiconductor device as claimed in claim 11, wherein the another of the plurality of notches is positioned above the drain from a plan view of the semiconductor device.

* * * * *